(12) United States Patent
Bird et al.

(10) Patent No.: US 6,545,553 B1
(45) Date of Patent: Apr. 8, 2003

(54) OSCILLATOR FOR GENERATING MICROWAVE RADIATION, AND METHOD OF ASSEMBLING AN OSCILLATOR

(75) Inventors: John Bird, Burton Village (GB); Gary Stephen Flatters, Swanpool (GB); Bernard Whitworth, Notts (GB)

(73) Assignee: Mitel Semiconductor Limited (GB)

( * ) Notice: Subject to any disclaimer, the term of this patent is extended or adjusted under 35 U.S.C. 154(b) by 0 days.

(21) Appl. No.: 09/414,949

(22) Filed: Oct. 8, 1999

(30) Foreign Application Priority Data

Oct. 8, 1998 (GB) ............................................. 9821832
Apr. 20, 1999 (GB) ............................................. 9909055

(51) Int. Cl.[7] ................................................ H03B 9/14
(52) U.S. Cl. .............. 331/96; 331/107 DP; 331/107 G; 331/107 R
(58) Field of Search ............................ 331/107 DP, 96, 331/107 G, 107 R (56) References Cited

U.S. PATENT DOCUMENTS

| | | | |
|---|---|---|---|
| 3,824,489 A | | 7/1974 | Spitalnik ............... 331/107 DP |
| 4,048,588 A | | 9/1977 | Zublin ......................... 331/96 |
| 4,048,589 A | | 9/1977 | Knox .................... 331/107 DP |
| 4,222,014 A | | 9/1980 | Ondria .................. 331/107 DP |
| 4,560,952 A | | 12/1985 | Tegel .................... 331/107 DP |
| 4,568,890 A | * | 2/1986 | Bates .......................... 331/96 |
| 4,727,338 A | | 2/1988 | Mamodaly ................... 331/96 |
| 6,005,450 A | * | 12/1999 | Schmidt et al. ....... 331/107 DP |

FOREIGN PATENT DOCUMENTS

| | | |
|---|---|---|
| DE | 35 18 377 | 11/1986 |
| DE | 35 44 912 | 6/1987 |
| EP | 0114 437 | 8/1984 |
| GB | 2227386 | 7/1990 |
| WO | WO 98/00904 | 1/1998 |

OTHER PUBLICATIONS

*CAD for MM–WAVE Resonators*, J. Freyer, et al.; European Microwave Conference Proceedings, GB, Nexus Business Communications, vol. CONF. 24, Sep. 5, 1994, pp. 273–278.

*Nachrichtentechnische Zeitschrift*, E. Kapser, H. Barth, J. Freyer; vol. 34, No. 11, Nov. 1981, pp. 768–774.

*GaAs Gunn Oscillators Reach the 140 GHz Range*; H Barth, W. Menzel; 1985 IEEE–MTT–S International Microwave Symposium Digest, 4; Jun. 06, 1985, pp. 367–369.

*A High Q Cavity Stabilized Gunn Oscillator at 94 GHz*; H. Barth, 1986 IEEE–MTT–S International Microwave Symposium Digest, 2, Jun. 04, 1986, pp. 179/182.

* cited by examiner

Primary Examiner—Arnold Kinkead
(74) Attorney, Agent, or Firm—Kilpatrick Stockton LLP (57) ABSTRACT

An oscillator comprising an oscillator body having a waveguide and a substantially cylindrical bore intersecting the waveguide, and a package comprising a heat sink having a substantially cylindrical portion and an oscillatory semiconductor device supported at one end of the heat sink. The diameter of the cylindrical portion of the heat sink in relation to the diameter of the bore is such that the heat sink is supported in the bore by one of an interference fit and a tight sliding fit, with the semiconductor device being located in the waveguide. The tight sliding fit or interference fit includes a layer of soft deformable material.

36 Claims, 7 Drawing Sheets

OSCILLATOR FOR GENERATING MICROWAVE RADIATION, AND METHOD OF ASSEMBLING AN OSCILLATOR

FIELD OF THE INVENTION

The present invention relates to an oscillator and in particular, although not exclusively, to a Gunn diode oscillator susceptible to automated mass production. The present invention relates also to a method of assembling oscillators and to a method of tuning oscillators.

DESCRIPTION OF THE PRIOR ART

Gunn diode oscillators are important components of radar systems. They are formed from gallium arsenide substrates which are processed in a particular manner to form devices known as Gunn diodes. A Gunn diode is incorporated into an oscillator package to form an oscillator which can generate microwave frequency electromagnetic radiation. Application of a dc voltage across a Gunn diode causes high frequency electron pulses across junctions within it, which pulses cause an oscillating electric field to be set up in the vicinity of the Gunn diode. The Gunn diode is located in, and supported by, a metallic oscillator body which defines a waveguide, supports other components of the oscillator, and uses the electric field to generate microwave frequency electromagnetic radiation. A prior art bias-tuned, second harmonic, radial mode oscillator is shown in section in FIG. 1.

Figure 1:
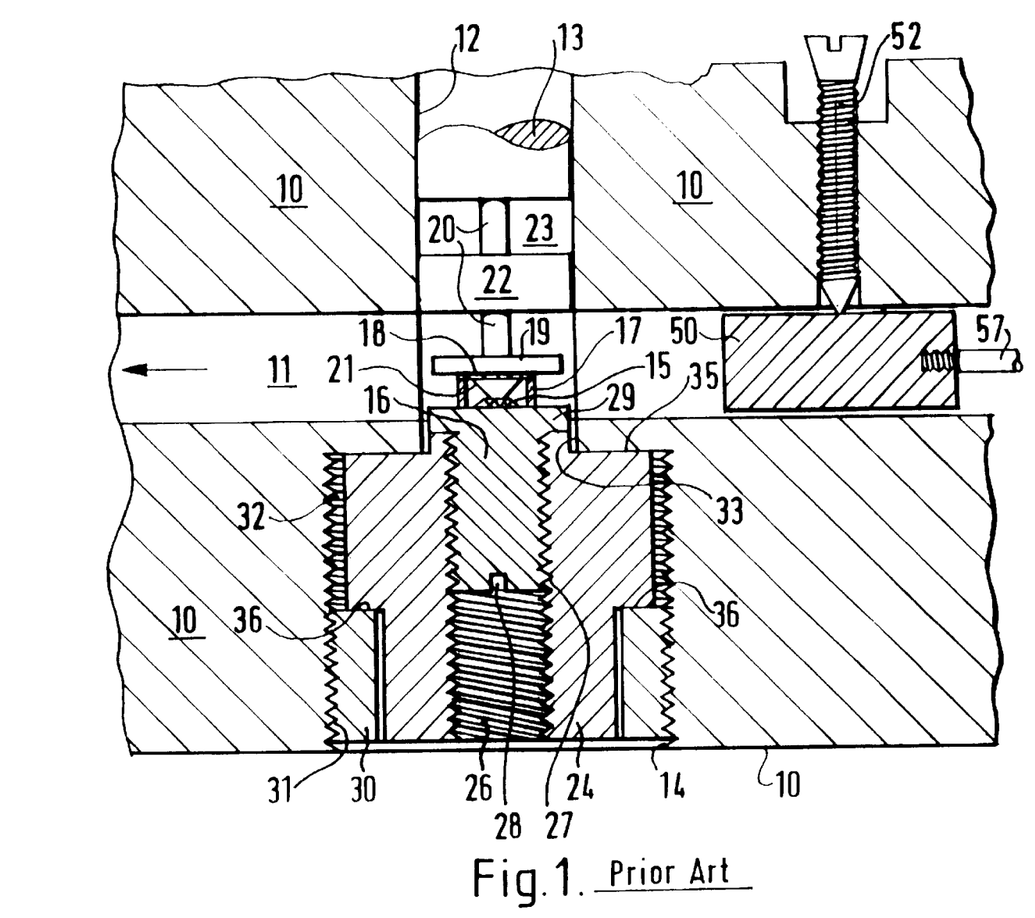
FIG. 1 shows a prior art Gunn diode oscillator.

In FIG. 1, a Gunn diode oscillator comprises generally a body 10 in which is defined an elongate waveguide 11 of rectangular cross-section, a bore 12 containing an RF choke 13, and a composite bore 14 on the opposite side of the waveguide to the bore. A Gunn diode chip 15 is ultrasonically scrubbed onto the top surface of a gold-plated, first heat sink 16. The Gunn diode 15 is enclosed by an annular, electrically-insulating tube 17, which is made from alumina, and an electrically-conductive lid 18. A gold-plated radial disk 19 is held in contact with the lid 18 by application of a constant spring force on an electrically conducting-connector 20, which passes along the central axis of the RF choke 13. The surface of the Gunn diode 15 closest to the RF choke 13 is electrically connected to the connector 20 by way of a wire bond or Maltese cross connection 21 made to the junction of the alumina tube 17 and the lid 18.

The RF choke 13 comprises alternate high impedance and low impedance sections. In this example, the low impedance section is a brass disk 22, and the high impedance section is of air 23. The thickness of each of the sections 22 and 23 is equal to three quarters of the wavelength of the electromagnetic radiation to be generated. Further low and high impedance sections 22 and 23 may be incorporated in the choke 13. The connector 20, and thus the radial disk 19, is electrically insulated from the oscillator body 10 by a layer of plastics material (not shown) which is wrapped around the substantially cylindrical form of the choke 13. The surface of the Gunn diode 15 furthest from the RF choke 13 is electrically and thermally connected to the oscillator body 10 by the first heat sink 16 and a second heat sink 24. The Gunn diode oscillator can be activated to generate microwave frequency electromagnetic radiation by application of a dc voltage across the oscillator body 10 and the electrical connector 20.

A short circuit 25, in the form of an elongate rectangular cross section metallic element, is movable axially along the waveguide 11. Movement of the short circuit 25 relative to the position of the radial disk 19 and Gunn diode 15 causes variation of the output power of the oscillator, as will be appreciated by those skilled in the art. Microwave frequency electromagnetic energy is radiated in the direction of the arrow.

The first heat sink 16 is connected to the second heat sink 24 by the mating of a threaded axial bore 26 of the second heat sink 24 and a screw thread 27 formed on the primary surface of the first heat sink 16. This connection is made by rotation of the first heat sink 16 relative to the second heat sink 24, achieved by rotation of a screwdriver or the like having a blade inserted in a groove 28 formed in the end of the heat sink 16 furthest from the RF choke 13, to screw the heat sinks 16 and 24 together. Rotation of these components is made until the surface of a flange 29 of the first heat sink 16 which is furthest from the RF choke 13 is in firm contact with a surface of the second heat sink 24 which is closest to the choke 13. A reasonable degree of thermal and electrical contact is thus made between the first and second heat sinks 16 and 24.

The second heat sink 24, and thus the first heat sink 16, is supported in the oscillator body 10 by the clamping action of an annular screw 30. The screw 30 has a thread 31 on its outer surface which mates with a threaded bore 32 of the composite bore 14. The second heat sink 24 is fixed relative to the body 10 by virtue of frictional forces at the washer shaped contact areas 35 and 36. A flange 29 of the first heat sink 16 and a part of the second heat sink 24 which is adjacent the flange 29 extend through a bore 33 linking the bore 32 with the waveguide 11 so that the Gunn diode 15 is supported in and located in the waveguide 11.

Because it is difficult to predict what effect the mating of the threads 26 and 27 will have on the concentricity of the outer cylindrical surface of the second heat sink 24 and the central axis of the first heat sink 16, it is usual to provide the bore 33 with a diameter 3 or 4% larger than the outer diameter of the flange 29. It has been found that the unscrewing of the annular screw 30 and subsequent re-screwing can cause the operating characteristics of the Gunn diode oscillator to change. In addition to a significant change in the level of the output power, a frequency change of up to 2% can occur as a result of such a re-assembly. This obviously introduces some undesirable variables into the characteristics that can be expected on oscillator assembly, even when tight component tolerances can be achieved. This frequency pulling and the changing of the output power has been thought to be caused by different alignment of the bond wires or Maltese cross connections 21 with respect to the axis of the waveguide 11. However, the inventor has found that the frequency pulling and output power change caused by the re-assembly is the result largely of the outer surface of the flange 29, and thus the outer surface of the part of the second heat sink 24 which is closest to the choke 13, being either more or less concentric with the bore 33 than previously. The concentricity has a bearing on the shape of the air gap between the outer surface of the heat sink 24 and the bore 33 and particularly on the minimum distance between the bore 33 and the outer surface of the heat sink 24. The inventor has performed experiments which show that the amount of frequency pulling is dependent on the amount of offset from concentric of the bore 33 and the outer surface of the flange 29 of the heat sink 16.

SUMMARY OF THE INVENTION

In accordance with a first aspect of the present invention, there is provided an oscillator for generating microwave frequency radiation comprising:

an oscillator body having formed therein a waveguide and a substantially cylindrical bore intersecting the waveguide; and a package comprising a heat sink having a substantially cylindrical portion and an oscillatory semiconductor device supported at one end of the heat sink;

in which the diameter of the cylindrical portion of the heat sink in relation to the diameter of the bore is such that the heat sink is supported in the bore by one of a) an interference fit, and b) a tight sliding fit, with the semiconductor device being located in the waveguide.

This oscillator is not susceptible to variations in frequency and output power which can occur due to variations in concentricity of the heat sink with the bore in which it is supported. This oscillator is also likely to be cheaper to produce than the prior art oscillators because it is not necessary to form the heat sink package with a threaded outer surface, or to form a second heat sink with a threaded bore. This oscillator is also likely to have greater surface area contact, because of the lack of threaded connections and because contact between the heat sink and the body can be made for all or much of the cylindrical outer surface of the heat sink, than the prior art oscillators. This increased contact will improve the thermal and electrical conductivity properties and is likely to improve the operating characteristics of the oscillator. This oscillator is more readily susceptible to automated mass production than the prior art oscillators because the controlled insertion of the package into the bore in the body is easily achievable by a robotic tool. Also, because the possibility that the package will move relative to the body may be substantially reduced, the possibility that the characteristics of the oscillator will change as a result of a mechanical knock or thermal cycling may also be reduced.

The interference or tight sliding fit preferably includes a layer of soft deformable material. The soft deformable material layer provides the advantage of lubricating the interference fitting of the package and the bore. The package may be barrel plated with soft gold to provide the layer. The plating may for example be 15 $\mu$m thick.

A surface of the heat sink adjacent the diode is preferably substantially flush with or slightly proud of a surface of the waveguide. This feature may ease mass production of the oscillator in that protrusion of the heat sink into the waveguide can be detected optically or mechanically, the detection being used to control the insertion of the package into the body.

The bore may be formed by the reaming of a rough bore formed in the body. This allows the diameter of the bore to be very accurately determined, thus assisting the interference fit. The rough bore may be formed by die casting the body. Cost savings can be achieved by allowing the body to be die cast in this way, prior art second harmonic oscillator bodies not being thought to be susceptible to die casting.

The body may comprise a second bore on the opposite side of the first bore to the waveguide, the second bore being threaded to allow a screw cap to retain the package within the oscillator body. This feature eliminates any possibility that the Gunn diode package will be dislodged by the spring force of the RF choke.

In accordance with a second aspect of the present invention, there is provided a method of assembling an oscillator for generating microwave frequency radiation, the oscillator comprising:

an oscillator body having formed therein a waveguide and a substantially cylindrical bore intersecting the waveguide; and a package comprising:

a heat sink having a substantially cylindrical portion, and an oscillatory semiconductor device supported at one end of the heat sink;

in which the diameter of the cylindrical portion of the heat sink is larger than the diameter of the bore, the method comprising inserting the package into the bore such that the package is retained by one of a) an interference fit, and b) a tight sliding fit, with the semiconductor device being located in the waveguide.

The first heat sink 16 is connected to the second heat sink 24 by the mating of a threaded axial bore 26 of the second heat sink and a screw thread 27 formed on the primary surface of the first heat sink. The second heat sink 24, and thus the first heat sink 16, is supported in the oscillator body 10 by the clamping action of an annular screw 30. The screw 30 has a thread 31 on its outer surface, which thread mates with a threaded bore 32 of the composite bore 14. A flange 29 of the first heat sink 16 and a part of the second heat sink 24 which is adjacent to the flange 29 extend through a bore 33 linking the bore 32 with the waveguide 11, so that the Gunn diode 15 is supported in, and located by the waveguide 11.

DESCRIPTION OF THE PRIOR ART

In setting up the oscillator so that it has the desired characteristics, the oscillator is assembled so that it has the structure thus far described. A short circuit 50 is inserted manually into the waveguide 11 by manipulation of a rod 51 which is temporarily screwed into a bore formed in an end of the short circuit which is furthest from the Gunn diode 15. The short circuit 50 comprises a machined brass component which has a rectangular cross-section of dimensions sufficiently less than the dimensions of the cross-section of the waveguide 11 to allow the short circuit to be moved along the longitudinal axis of the waveguide without encountering significant mechanical resistance from the walls of the waveguide.

Figure 2:
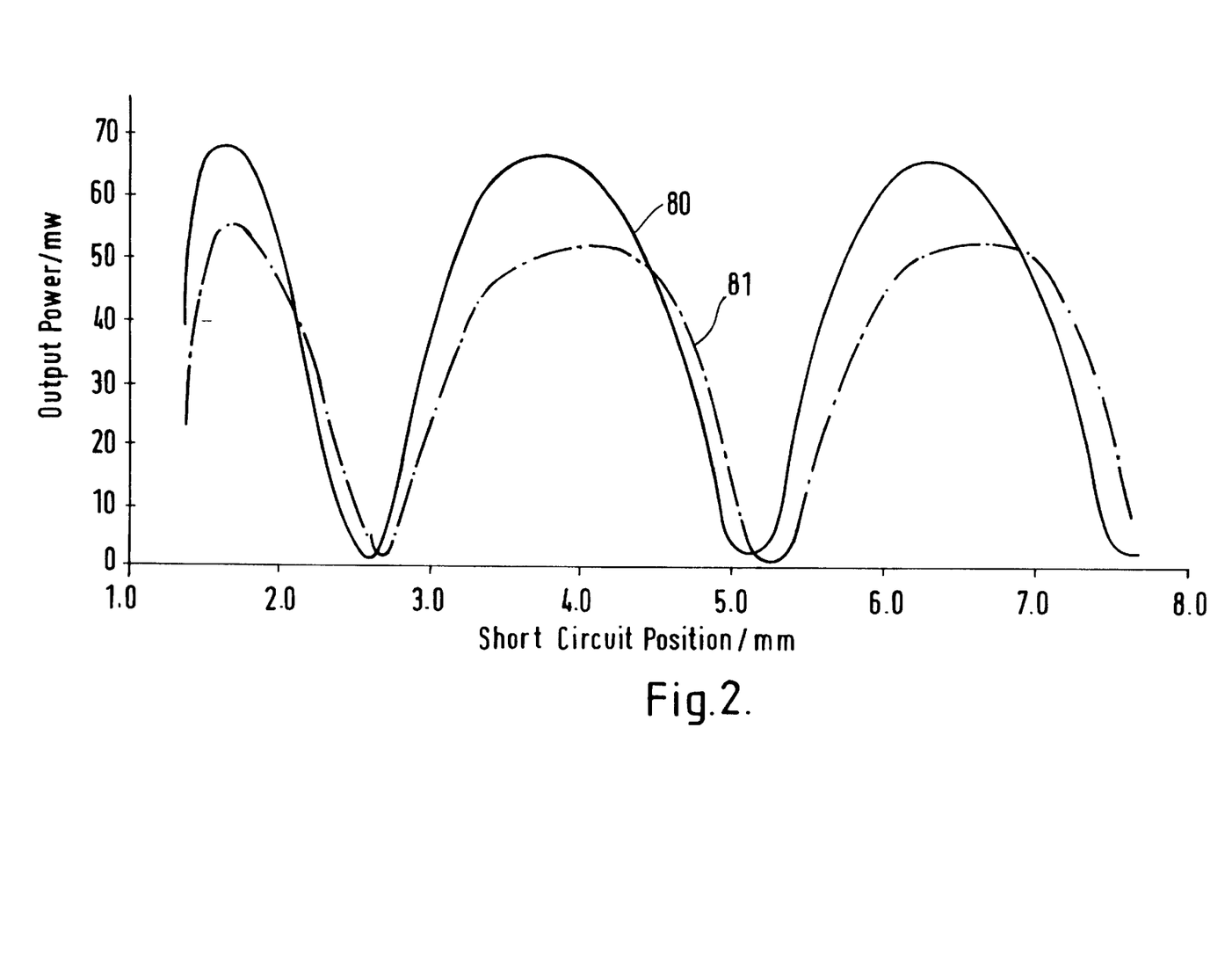
FIG. 2 shows how the output power of the FIG. 1 oscillator varies with short circuit displacement.

The displacement of the face of the short circuit 50 closest to the Gunn diode 15 along the waveguide 11 determines the output power of the oscillator in the relationship illustrated in FIG. 2. The curve 80 relates to a Gunn diode voltage of 6.5V, and the curve 81 relates to a Gunn diode voltage of 4.5V. The short circuit 50 is moved toward the Gunn diode 15, from a position approximately three quarters of a wavelength of the radiation from the position of the Gunn diode by manipulation of the rod 51 until the output power of the oscillator is equal to a desired value. A desired value will typically be 50 mW, which is about two thirds of the maximum output power. When the position of the short circuit 50 is such that the output power level is at the desired power level, a screw 52 is rotated to lock the short circuit in place. The rod 51 may then be unscrewed and removed from the short circuit 50.

However, it has been found that the output power of the oscillator can vary quite considerably from the relationship shown in FIG. 2, and that there may be a number of different output power levels which can be measured for a single given displacement of the short circuit 50. Also, it has been found that the output power level can change as a result of the screw 52 being used to lock the short circuit 50 in position in the waveguide 11.

Such variation of the output power is undesirable, and is likely to hinder the setting up process if the process is automated. Automated setting up is complicated also by the fact that the rod 51 and the screw 52 will require separate robotic tools to operate at the same time.

SUMMARY OF THE INVENTION

In accordance with a third aspect of the present invention, there is provided an oscillator for generating microwave frequency radiation, the oscillator comprising:

an oscillator body having formed therein a waveguide;

an oscillatory semiconductor device supported in the waveguide; and a short circuit having a skin of soft metal on at least one outer surface thereof;

the short circuit having dimensions selected such that the skin allows the short circuit to be supported in the waveguide by one of a) a tight sliding fit, and b) an interference fit.

This invention arose, in part, as a result of determining that the power level variations in the above described prior art oscillator is caused by movement of the short circuit 50 other than longitudinally in, and particularly vertically in, the waveguide 11; and the location of, and extent of, electrical contact between the oscillator body 10, the short circuit 50 and the screw 52.

An oscillator constructed in accordance with this aspect of the present invention will not experience variations in output power level caused by movement of the short circuit, other than in a longitudinal direction, because the short circuit is firmly supported in the waveguide by the tight sliding or interference fit. Automated oscillator set-up may be facilitated, both by the reduced number of robotic tools needed for simultaneous operation, and particularly by the avoidance of power level variations. An oscillator constructed in accordance with this aspect of the present invention may also be more mechanically rugged, in that a tight sliding or interference fit may be more resistant to mechanical knocks than the lock-screw arrangement of the prior art. Mechanical integrity is of particular importance where correct operation of the oscillator is important for safety, such as in, for example, automotive autonomous cruise control applications. Here, the oscillator is likely to be subjected to wide temperature variations and to mechanical vibration.

The cost of the components for an oscillator constructed in accordance with this invention is likely to be lower than the cost of the components of the prior art oscillator described above, as there is no longer the need for a threaded bore to support the screw 52, or for the screw 52 itself. Also, a circular cross-section short circuit is likely to be less expensive to manufacture than the prior art rectangular cross-section short circuit especially so in volume production.

The transition between the first and section portions of the waveguide is preferably a step transition. Such an arrangement may be easier to machine than other possible arrangements, which may therefore reduce manufacturing costs.

The transition is preferably at a position which is chosen to provide the oscillator with a smooth power tuning characteristic.

In accordance with a fourth aspect of the present invention, there is provided a method of assembling an oscillator for generating microwave frequency radiation, the oscillator comprising: an oscillator body having formed therein a waveguide, an oscillatory semiconductor device supported in the waveguide; and a short circuit having a skin of soft metal on at least one outer surface thereof; in which the cross-sectional dimensions of the short circuit with the skin are larger than the cross-sectional dimensions of the waveguide, the method comprising inserting the short circuit into the waveguide such that the short circuit is retained in the waveguide by one of a) an interference fit, and b) a tight sliding fit.

DESCRIPTION OF THE PRIOR ART

Although coarse tuning of the oscillator frequency is performed prior to the output power of the oscillator being set, fine tuning is performed afterward. Where the oscillator is to be used in an automotive autonomous cruise control application, it may be desired for the oscillator to be swept from 76.1 GHz to 76.9 GHz. Such a sweep may be obtained by ramping the dc voltage applied to the Gunn diode from 4.5 volts to 6.0 volts. It is common with such oscillators to find that, due to variations in the mechanical arrangement of the package 16, 17, 18 and variations in the GaAs Gunn diode itself, the frequency of radiation obtained from a 6 volt supply can vary by up to 3 GHz either side of the desired frequency.

Coarse tuning is achieved by the replacement of the RF choke and radial disk assembly with an assembly having a disk of an appropriate diameter. During the coarse tuning, the oscillator is set up so that a frequency between 77 and 78 GHz is obtained when 6.0 volts is applied across the Gunn diode. An inventory of, typically, seven choke and disk assemblies, each of different disk diameter, will be necessary to obtain a coarse-tuned frequency sufficiently near to the desired frequency to allow fine tuning. Fine tuning is achieved by insertion of a frequency tuning probe into the volume between the radial disk 19 and the heat sink 16. The presence of the frequency tuning probe in this volume, because the material from which it is made has different dielectric properties to the air in the volume, disturbs the electric field between the radial disk 19 and the heat sink 16. The disturbance of the electric field causes the oscillation frequency of the radial mode oscillator, and thus the frequency of the radiation generated, to change. The extent of the change in frequency is dependent on, in particular, the extent of protrusion of the probe into the volume, the dimensions of the probe and the material used to make the probe.

It has been known for a probe made from either metal or dielectric, having a cylindrical form, and having a diameter of 0.2 to 0.3 mm, to be used to tune oscillators of the type described. Such a probe allows a reduction of the oscillator frequency as the probe is moved towards the tube 17. Because such probes act directly on the radial mode oscillator, the operating frequency is hypersensitive to their position. Large amounts of frequency change are often obtained from a relatively small movement of the probe, which can make fine tuning of the oscillator frequency difficult. Further problems are experienced because the small size of the probes make them difficult to manufacture, handle and support.

It has been found also that the presence of the probe in the radial mode oscillator can cause unpredictable fluctuations in the output power of the oscillator. This clearly is undesirable.

SUMMARY OF THE INVENTION

In accordance with a fifth aspect of the present invention, there is provided an oscillator for generating microwave frequency radiation the oscillator comprising:

an oscillator body;

a waveguide formed in the oscillator body;

an oscillator package supporting an oscillatory semiconductor device in the waveguide, the oscillator package providing mechanical protection for the oscillatory semiconductor device;

a conduit formed in the oscillator body, the conduit intersecting the waveguide;

a choke assembly supported in the conduit;

a radial disk which is mechanically connected to the choke assembly and which is urged by the choke assembly to be in contact with the oscillator package in the waveguide; and a frequency tuning probe which is arranged to be movable into the coaxial resonator volume between the radial disk and the choke assembly to alter the frequency of the radiation generated by the oscillator.

In accordance with a sixth aspect of the present invention, there is provided a method of tuning an oscillator for generating microwave frequency radiation, the oscillator comprising: an oscillator body; a waveguide formed in the oscillator body; an oscillator package supporting an oscillatory semiconductor device in the waveguide, the oscillator package providing mechanical protection for the oscillatory semiconductor device; a conduit formed in the oscillator body, the conduit intersecting the waveguide; a choke assembly supported in the conduit; a radial disk which is mechanically connected to the choke assembly and which is urged by the choke assembly to be in contact with the package in the waveguide, the method comprising moving a frequency tuning probe into the volume between the radial disk and the choke assembly.

Embodiments of the present invention will now be described, by way of example only, with reference to the accompanying drawings.

DETAILED DESCRIPTION OF THE PREFERRED EMBODIMENT

Figure 3:
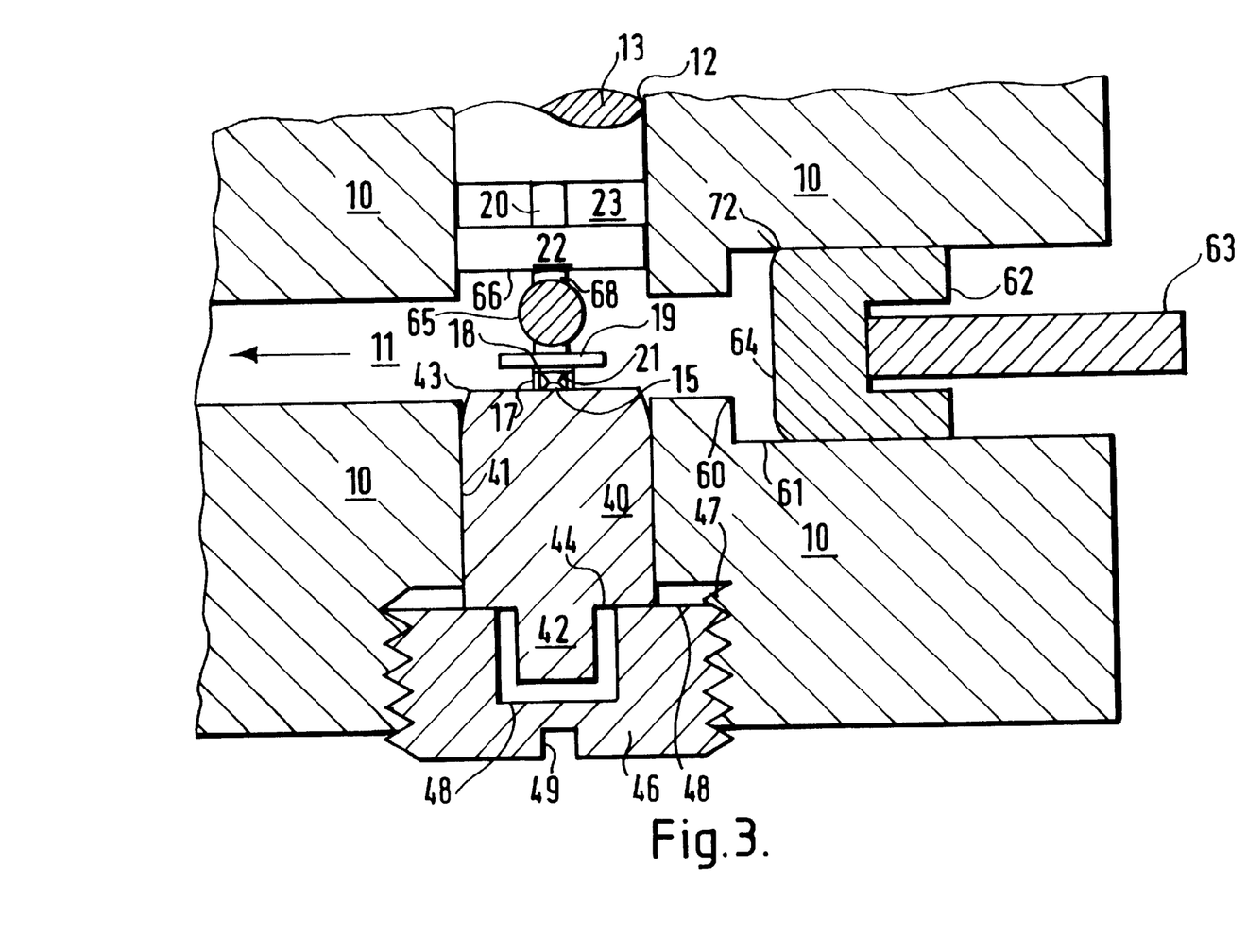
FIG. 3 shows an oscillator in accordance with the present invention in the form of a Gunn diode oscillator.
Figure 4:
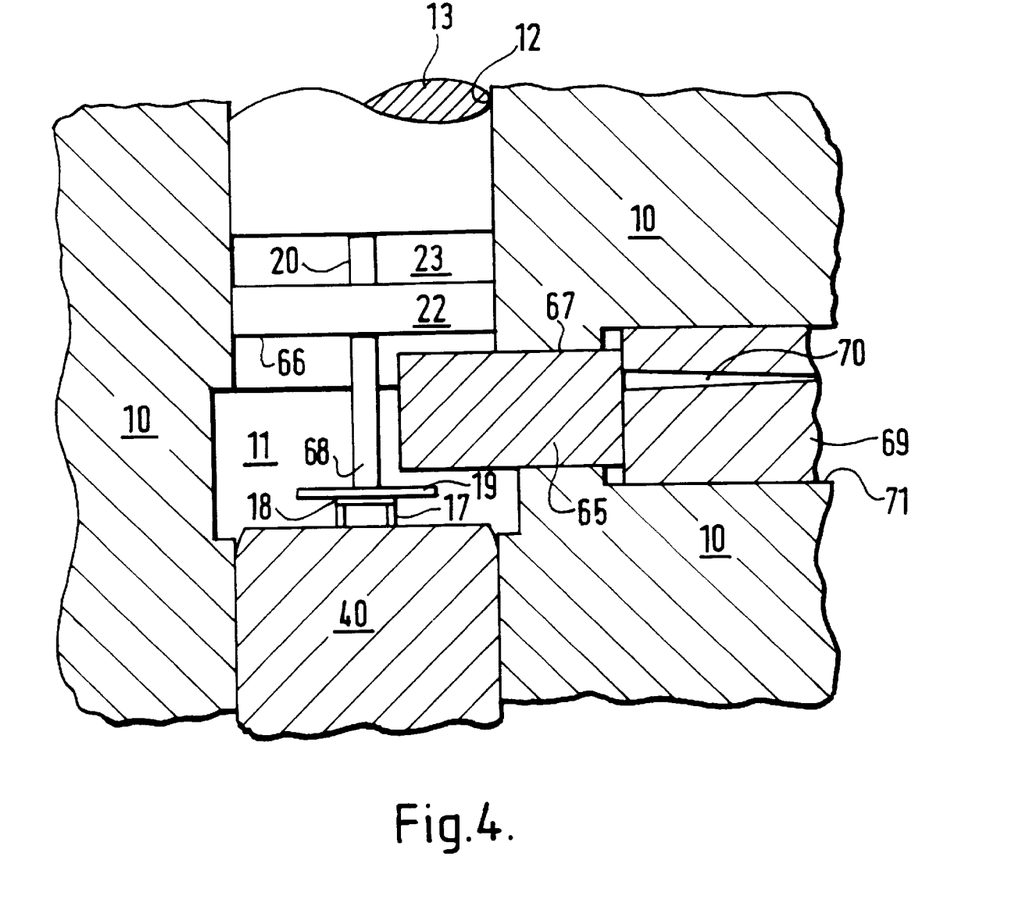
FIG. 4 shows an orthogonal view of the FIG. 3 oscillator.

Referring to FIGS. 3 and 4, in which reference numerals have been retained for like elements, the Gunn diode oscillator comprises a heat sink 40 having a substantially cylindrical main body 40 and a tail piece 42, the main body being interference fitted in a bore 41 of the oscillator body 10. The heat sink 40, 42 with the Gunn diode chip 15, the alumina tube 17 and the lid 18 together form a Gunn diode package which provides mechanical protection for the Gunn diode chip. The tail piece 42 is cylindrical and has a diameter equal to half of the diameter of the main body 40. The tail piece 42 is axially aligned with the main body 40. The edge 43 of the main body 40 closest to the RF choke 13 is rounded or chamfered, so as to ease entry of the heat sink 40, 42 into the bore 41, and to prevent swarf being pushed into the waveguide 11 during assembly. Insertion of the heat sink 40, 42 into the bore 41 is made by a robotic tool which grasps the tail piece 42 and forces it towards the RF choke 13. The robotic tool is controlled to discontinue application of this force when it is detected that the uppermost surface of the main body 40 has extended into the waveguide 11. This can be achieved using conventional optical or mechanical techniques.

In producing the Gunn diode oscillator, the oscillator body 10 is die cast in an alloy of zinc. The die cast oscillator body 10 includes a cylindrical bore having a diameter which is less than the diameter of the bore 41. This rough bore is then reamed to produce the bore 41. In this way, the bore 41 can be provided with dimensions which are very accurately predictable and controllable. The heat sink 40, 42 can then be inserted into the oscillator body 10 without further processing of the bore 41.

The heat sink 40, 42 is machined from a single piece of copper, and gold plated to a depth of 15 $\mu$m using a barrel plating process. Lower depth plating may also be used. Barrel plating is preferred because it is low cost and it deposits an even thickness of soft gold on the surfaces of the main body 40 which are of particular importance, i.e. the cylindrical outside surface which contacts the bore 41 when installed in the oscillator body 10. In the barrel plating process it is also necessary to deposit a layer of soft gold on the surface of the alumina tube 17 which is closest to the RF choke 13. This is advantageous in that it provides a good surface on which to attach the bond wires or Maltese cross connection 21.

The oscillator further comprises a screw cap 46 which mates with a threaded second bore 47 of the oscillator body 10. A surface 48 of the screw cap 46 connects with that surface 44 of the main body 40 which is closest to the tail piece 42 with a force which is determined by the final torque applied to a tool, and thus to a groove 49 of the screw cap 46, which is used to screw the screw cap into the oscillator body 10. Although the screw cap 46 is not essential, its presence may be desirable where the connector 20 and 68 of the RF choke 13 is spring loaded to apply a reasonably high force onto the package, or where there is a possibility that the heat sink 40, 42 will move relative to the oscillator body 10 for other reasons. The screw cap 46 need not be provided if the outer diameter of the main body 40 is sufficiently larger than the diameter of the bore 41 that the force required to dislodge the main body 40 in the oscillator body 10 will not be experienced under normal circumstances.

In an alternative embodiment (not shown), the screw cap is replaced by a supporting shoulder in the body, and the Gunn heat sink 40 is inserted from above.

Where the oscillator is to operate in the frequency band of 76.1 to 76.9 GHz, the waveguide 11 will typically have a cross-section of 3.10 mm by 1.55 mm. With this frequency band, the oscillator body 10 is formed with a rough bore which has a diameter of 2.85 mm and which intersects the waveguide 11 on its largest side, and which is perpendicular to the axis of the waveguide 11. This bore is then reamed to form the bore 41 with a diameter of no less than 2.910 mm and no greater than 2.915 mm. In this way, a heat sink having a cylindrical main body 40 with a diameter anywhere in the region of 2.91 mm to 2.93 mm, including the gold plating, will form a good interference or tight sliding fit when inserted into the bore 41 of the oscillator body 10. The primary requirement of this interference or tight sliding fit is that the air gap between the heat sink 40, 42 and the oscillator body 10, which is present in the prior art devices, is avoided. Although it is not essential, it is preferred that the tight sliding or interference fit prevents the heat sink 40, 42 from moving relative to the oscillator body 10, except with the application of a large force onto the heat sink 40, 42.

As shown in FIG. 3, the waveguide 11 has a step transition 60 from the rectangular form that exists in the vicinity of the Gunn diode 15 to a substantially circular bore 61. The step transition 60 acts as a capacitive reactance. Its position thus influences the output power curve. The position of the transition is chosen so as to allow smooth and continuous power adjustment by a short circuit 62. The position depends on the type of bias interconnection 21. In this embodiment, the transition is three quarters of the wavelength of the microwaves, or 3.9 mm.

The bore 61 is formed by machining a rough bore which is die cast in the body 10. The diameter of the bore 61 is chosen so that the wavelength is the same in both the rectangular and circular waveguide sections.

The bore 61 is formed by machining the oscillator body 10 to a diameter of between 3.500 mm and 3.505 mm. The short circuit 62 is an annealed copper element having an outside diameter of between 3.49 and 3.50 mm. This short circuit 62 is plated with a skin of soft tin to a depth of about 15 mm to bring the outside dimension of the short circuit to between 3.52 and 3.54 mm. The skin of tin acts as a dry lubricant when sandwiched between the harder metals of the body 10 and the short circuit 62, which assists entry of the short circuit into the bore 61. A chamfered edge 72 provided on the forward end of the short circuit 62 allows surplus tin to be displaced to the rear of the short circuit 62, and not towards the Gunn diode 15. The short circuit 62 is thus supported in the bore 61 by a tight sliding or interference fit, and thus is provided with a good and continuous electrical connection to the oscillator body 10.

Figure 5:
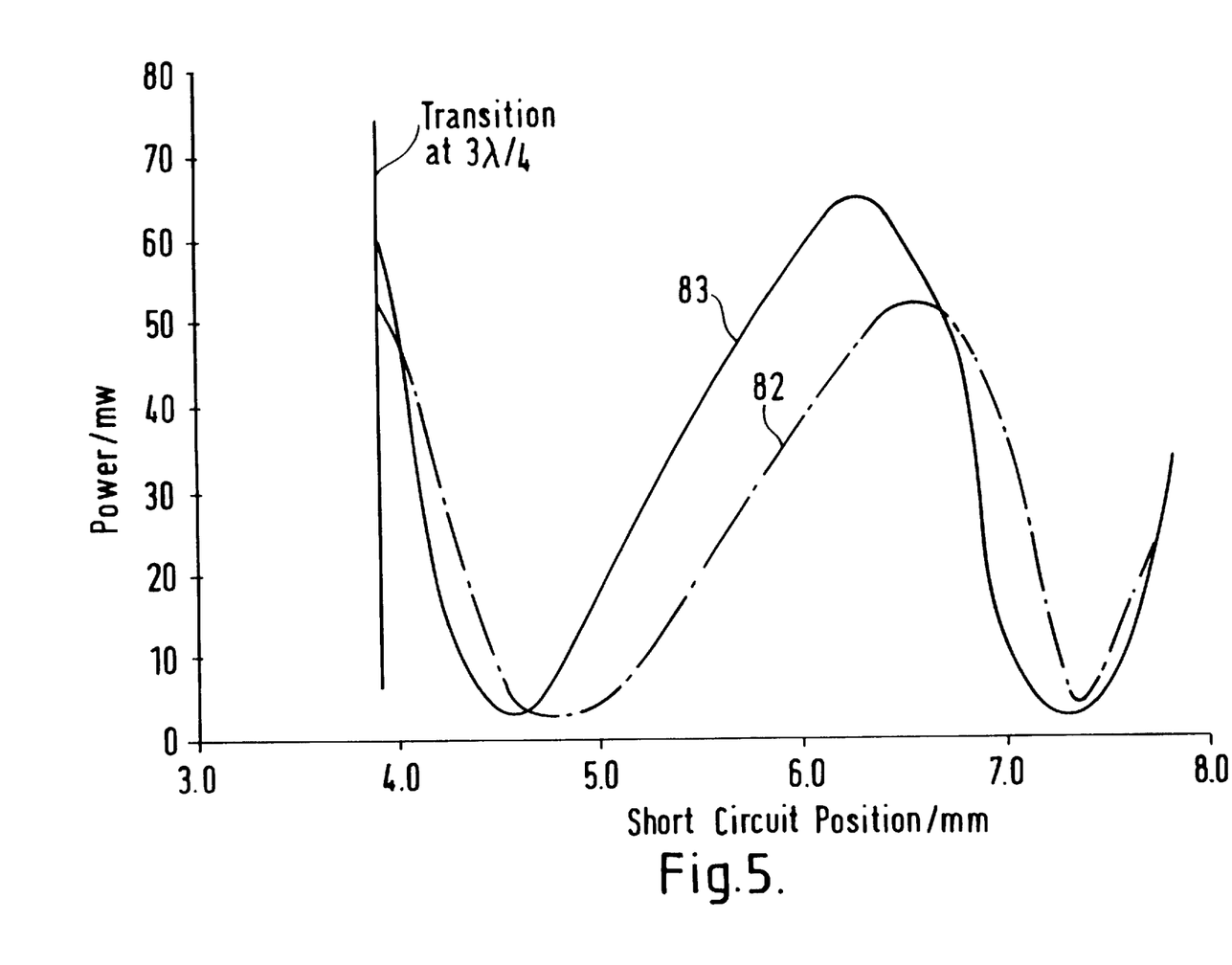
FIG. 5 shows how the output power of the FIG. 3 and FIG. 4 oscillator varies with short circuit displacement.

FIG. 5 shows the relationship between short circuit displacement and oscillator output power. The curve 82 relates to a Gunn diode potential of 4.5 volts, and the curve 83 relates to a potential of 6.5 volts. These curves relate to the case where the interconnection 21 is a wire bond connection. Importantly, it will be noted that each curve 82 and 83 is monotonic between maxima and minima. Accurate setting of the output power of the oscillator is easily achievable, because the short circuit 62 is self supporting in the bore 61. Thus, no locking screw is required, and the short circuit 62 is unable to move in the waveguide, other than by application of a force to a rod 63, which is used to set the output power. Even removal of the rod 63, when the output power has been set, is not able to cause movement of the short circuit 62.

The oscillator further comprises a frequency tuning probe 65 which extends through a bore 67 drilled in the body 10 which bore, if extrapolated, intersects the longitudinal axis of the choke assembly 13 at right-angles. The frequency tuning probe 65 is thus movable into the volume between the radial disk 19 and the choke assembly 13 by manipulation of its rear end. Because the distance between the radial disk 19 and the face 66 of the choke assembly 13 which is closest to the Gunn diode 15 is significantly greater than the distance between the radial disk 19 and the heat sink 40, the probe 65 is able to have a larger diameter than the prior art frequency tuning probes. This means that the probe 65 can be stiffer, easier to manufacture, and easier to secure positively in the oscillator body 10.

The face 66 of the choke 13, the uppermost surface of the disk 19 and the conductive connector 68 together form a co-axial resonator. The resonant frequency of this co-axial resonator is dependent in part on the length of the connector 68. The co-axial resonator is magnetically coupled to the radial mode oscillator formed between the disk 19 and the heatsink 40, 42. Thus, adjustment of the resonant frequency of the co-axial resonator, by the insertion of the frequency tuning probe 65 into it, varies the oscillation frequency of the radial mode oscillator.

Figure 6:
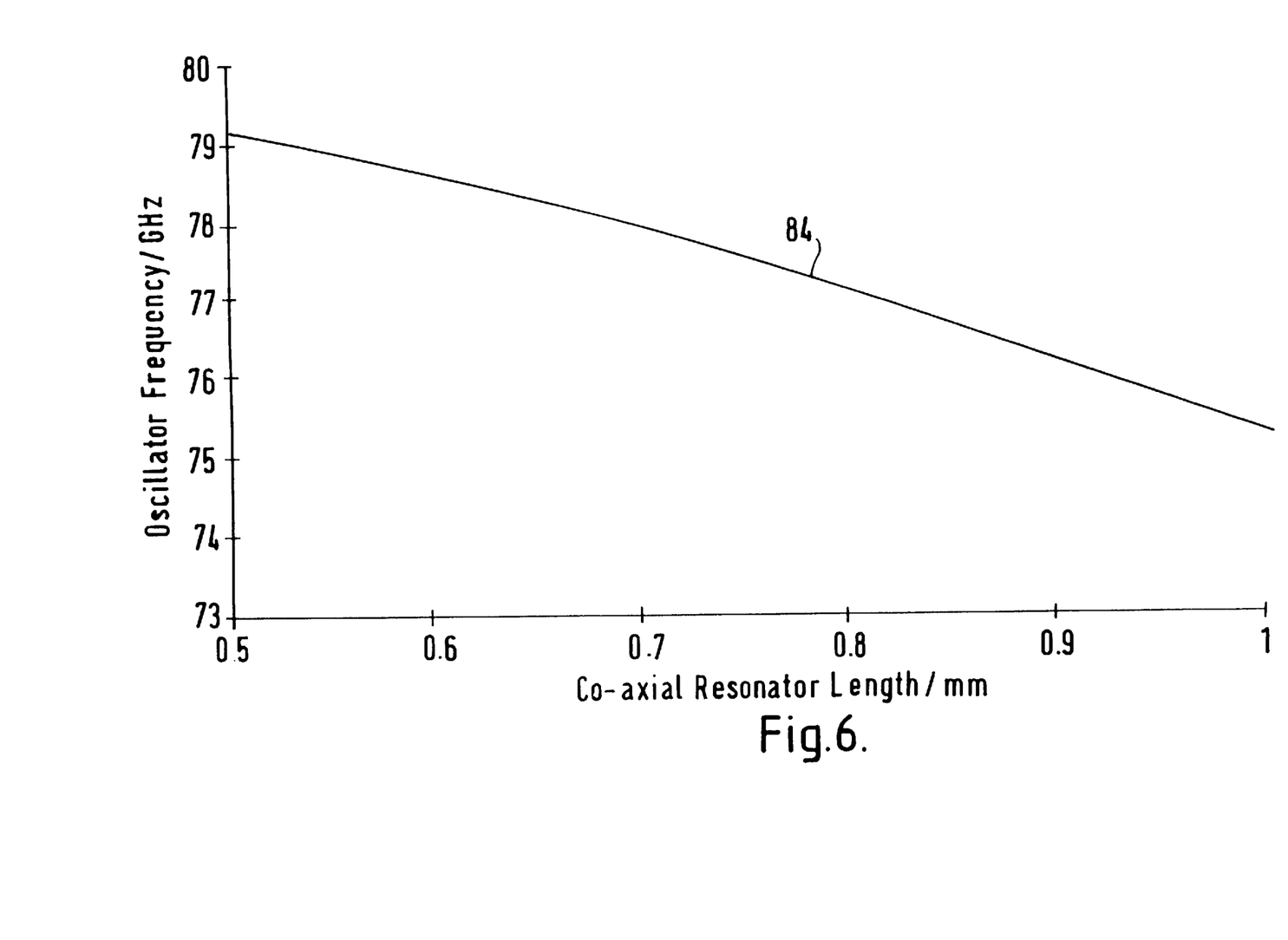
FIG. 6 shows the relationship between connector length and oscillator frequency.
Figure 7:
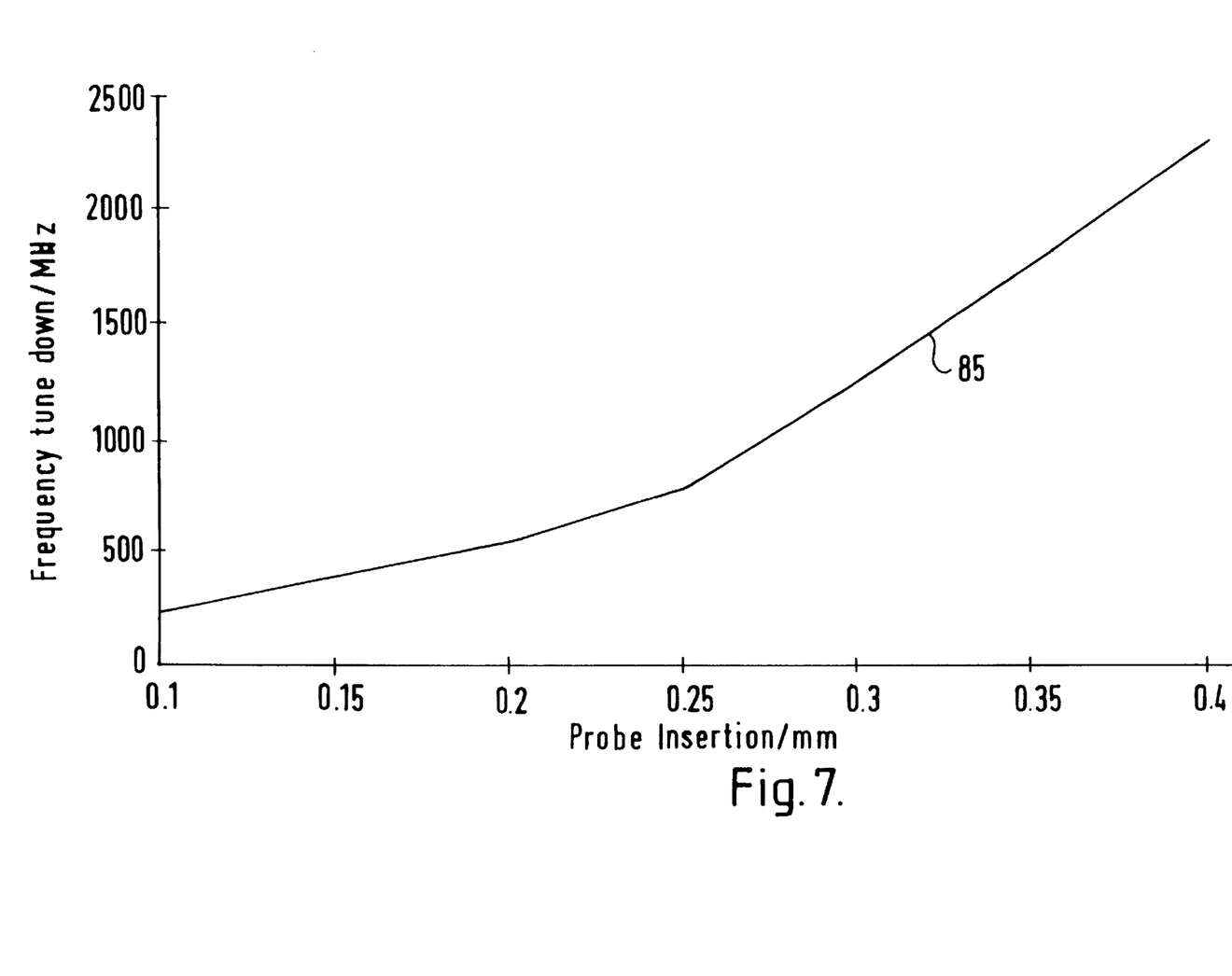
FIG. 7 shows the relationship between tuning and probe protusion into resonator.

The face 66 is recessed from the form of the waveguide 11, which thereby provides a longer co-axial resonator than would be provided otherwise. This feature has an affect on the resonant frequency of the co-axial resonator, which is dependent on the length of the connector 68, the affect being to reduce the frequency. The relationship between the length of the connector 68 and the oscillator frequency is shown by a curve 84 in FIG. 6. Significantly, the increased length of the connector allows a larger diameter frequency tuning probe 65 to be used which, in turn, allows more tuning of the oscillator than is possible with a smaller diameter probe. The amount of tuning possible depends also on the extent of protrusion of the probe 65 into the co-axial resonator, and the material from which the probe is made. This is illustrated by the curve 85 in FIG. 7.

The probe comprises a forward section 65 which has cross-sectional dimensions selected for altering the frequency of the co-axial resonator, and a rear section 69. The rear section 69 has a larger cross-sectional diameter than the forward section 65. The forward section 65 is supported in the bore 67, whilst the rear section 69 is supported in a larger diameter bore 71.

The rear section 69 of the frequency tuning probe 65 is provided with surface features which allow it to be supported in the bore 71 in such a way that movement of the frequency tuning probe 65, which would of course affect the frequency of the oscillator output signal, is prevented. Particularly, these surface features comprise three longitudinally-aligned grooves 70 spaced regularly around the circumference of the radial cross-section of the probe 65. The grooves 70 are substantially triangular in cross-section, which thereby allow material from the body 10 to be displaced into them when the probe 65 is forced into the bore 71. The rear end of the probe 69, therefore, bites into the bore as it is pushed into the waveguide during oscillator tuning. The probe 65 is thus less likely to be movable accidentally after tuning of the oscillator is complete.

In an alternative embodiment, not shown, the probe 65 is a constant diameter cylindrical probe which is plated with a soft metal such as silver, tin or gold. Here, the probe is supported in a simple bore, rather than a composite bore, by an interference or tight sliding fit provided by the soft metal plating. This probe is thus of simpler construction, and may provide an improved electrical connection with the oscillator body 10.

Instead of the body being die cast, it may be machined from aluminium or any other suitable material. The steps necessary to machine the body will be apparent to the skilled person.

Although the embodiment relates to a Gunn diode oscillator, it will be appreciated that the present invention is also applicable to Impatt diode oscillators and the like.

What is claimed is:

1. An oscillator for generating microwave frequency radiation comprising:
    an oscillator body having formed therein a waveguide and a substantially cylindrical bore intersecting the waveguide; and a package comprising a heat sink having a substantially cylindrical portion and an oscillatory semiconductor device supported at one end of the heat sink;

in which the diameter of the cylindrical portion of the heat sink in relation to the diameter of the cylindrical bore is such that the heat sink is supported in the bore by one of a) an interference fit, and b) a tight sliding fit, with the semiconductor device being located in the waveguide, the tight sliding or interference fit including a layer of soft deformable material.

2. An oscillator in accordance with claim 1, in which the package is barrel plated with soft gold to provide the layer.

3. An oscillator in accordance with claim 1, in which a surface of the heat sink adjacent the semiconductor device is one of a) substantially flush with, and b) slightly proud of, a surface of the waveguide.

4. An oscillator in accordance with claim 1, in which the cylindrical bore is formed by the reaming of a rough bore formed in the oscillator body.

5. An oscillator in accordance with claim 4, in which the rough bore is formed by die-casting the oscillator body.

6. An oscillator in accordance with claim 1, in which the body further comprises a second bore on the opposite side of the cylindrical bore to the waveguide, the second bore being threaded to allow a screw cap to retain the package within the body.

7. A method of assembling an oscillator for generating microwave frequency radiation, the oscillator including an oscillator body having formed therein a waveguide and a substantially cylindrical bore intersecting the waveguide, a package including a heat sink having a substantially cylindrical portion including a layer of soft deformable material, and an oscillatory semiconductor device supported at one end of the heat sink, in which the diameter of the cylindrical portion of the heat sink is larger than the diameter of the cylindrical bore, the method comprising:

inserting the package into the cylindrical bore such that the package is retained by one of a) an interference fit including a layer of soft deformable material, and b) a tight sliding fit including a layer of soft deformable material, with the semiconductor device being located in the waveguide.

8. A method in accordance with claim 7, in which the package is barrel plated with soft gold to provide the layer.

9. A method in accordance with claim 7, in which a surface of the heat sink adjacent the semiconductor device is one of a) substantially flush with, and b) slightly proud of, a surface of the waveguide.

10. A method in accordance with claim 7, in which the bore is formed by the reaming of a rough bore formed in the oscillator body.

11. A method in accordance with claim 10 in which the rough bore is formed by die-casting the oscillator body.

12. A method in accordance with claim 7 in which the cylindrical bore is a first bore and in which the oscillator body further comprises a second bore on a side of the first bore opposite to the waveguide, the second bore being threaded to allow a screw cap to retain the package within the oscillator body.

13. An oscillator for generating microwave frequency radiation, the oscillator comprising:

an oscillator body having formed therein a waveguide;

an oscillatory semiconductor device supported in the waveguide; and a short circuit having a skin of soft metal on at least one outer surface thereof;

the short circuit having dimensions selected such that the skin allows the short circuit to be supported in the waveguide by one of a) a tight sliding fit, and b) an interference fit.

14. An oscillator according to claim 13, wherein the short circuit is substantially circular in cross-section, the waveguide has a first portion of substantially rectangular cross-section, in which first portion is supported the oscillatory semiconductor device, and a second substantially circular bore portion, the short circuit being supported in the second portion by the one of a) tight sliding fit, and b) interference fit.

15. An oscillator according to claim 14, in which a transition between the first and second portions of the waveguide is a step transition.

16. An oscillator according to claim 14, in which the position of a transition between the first and second portions is chosen to provide the oscillator with a smooth power tuning characteristic.

17. An oscillator according to claim 14, in which the diameter of the cross-section of the second portion of the waveguide is chosen so that the wavelength is substantially the same in both the first and second portions of the waveguide.

18. An oscillator according to claim 13, in which the oscillator body is die cast in metal.

19. An oscillator according to claim 18, in which the second portion of the waveguide is formed by machining a rough bore formed in the oscillator body.

20. An oscillator according to claim 13, in which the oscillator is machined from a solid piece of aluminium alloy.

21. A method of assembling an oscillator for generating microwave frequency radiation, the oscillator comprising: an oscillator body having formed therein a waveguide, an oscillatory semiconductor device supported in the waveguide; and a short circuit having a skin of soft metal on at least one outer surface thereof; in which the cross-sectional dimensions of the short circuit with the skin are larger than the cross-sectional dimensions of the waveguide, the method comprising inserting the short circuit into the waveguide such that the short circuit is retained in the waveguide by one of a) an interference fit, and b) a tight sliding fit.

22. A method according to claim 21, further comprising die casting the oscillator body in metal.

23. A method according to claim 22, further comprising machining a rough bore, which is cast in the oscillator body to form the second portion of the waveguide.

24. A method according to claim 21, further comprising machining the oscillator body from a piece of solid aluminium alloy.

25. An oscillator for generating microwave frequency radiation, the oscillator comprising:

an oscillator body;

a waveguide formed in the oscillator body;

an oscillator package supporting an oscillatory semiconductor device in the waveguide, the oscillator package providing mechanical protection for the oscillatory semiconductor device;

a conduit formed in the oscillator body, the conduit intersecting the waveguide;

a choke assembly supported in the conduit;

a radial disk which is mechanically connected to the choke assembly and which is urged by the choke assembly to be in contact with the oscillator package in the waveguide; and a frequency tuning probe which is arranged to be moveable into the coaxial resonator volume between the radial disk and the choke assembly to alter the frequency of the radiation generated by the oscillator, the longitudinal axis of the frequency tuning probe being substantially perpendicular to the longitudinal axis of the choke and substantially perpendicular to the longitudinal axis of the waveguide.

26. An oscillator according to claim 25, in which the frequency tuning probe is movable along a longitudinal axis which intercepts a longitudinal axis of the choke assembly.

27. An oscillator according to claim 25, in which that surface of the choke assembly which is nearest to the radial disk is substantially flush with one surface of the waveguide.

28. An oscillator according to claim 25, in which a surface of the choke assembly which is nearest to the radial disk is recessed from the form of the waveguide.

29. An oscillator according to claim 25, in which the frequency tuning probe has a skin of soft metal on at least one outer surface thereof, thereby to provide one of a) a tight sliding fit, and b) an interference fit in a probe supporting conduit formed in the oscillator body.

30. An oscillator according to claim 25, in which the frequency tuning probe has a generally cylindrical form.

31. An oscillator according to claim 30, in which the surface of at least the rear portion of the frequency tuning probe is formed with at least two longitudinal grooves.

32. An oscillator according to claim 31, in which each groove is tapered so as to have a larger width at its forward end.

33. An oscillator according to claim 31, in which the frequency tuning probe includes a coaxial resonator penetrating portion and a supporting portion, the supporting portion being of different cross-sectional dimensions than the coaxial resonator penetrating portion, the supporting portion having a skin of soft metal formed on at least one outer surface thereof, the supporting portion forming one of a) a tight sliding fit, and b) an interference fit in a probe supporting conduit formed in the oscillator body.

34. An oscillator according to claim 30, in which the frequency tuning probe includes a coaxial resonator penetrating portion and a supporting portion, the supporting portion being of different cross-sectional dimensions than the coaxial resonator penetrating portion and being associated with a probe supporting conduit formed in the oscillator body.

35. A method of tuning an oscillator for generating microwave frequency radiation, wherein the oscillator includes an oscillator body, a waveguide formed in the oscillator body, an oscillator package supporting an oscillatory semiconductor device in the waveguide, and providing mechanical protection for the oscillatory semiconductor device, a conduit formed in the oscillator body, the conduit intersecting the waveguide, a choke assembly supported in the conduit, and a radial disk which is mechanically connected to the choke assembly and which is urged by the choke assembly to be in contact with the package in the waveguide, the method comprising:

moving a frequency tuning probe into the volume between the radial disk and the choke assembly in a direction which is substantially perpendicular to the longitudinal axis of the choke and which is substantially perpendicular to the longitudinal axis of the waveguide.

36. An oscillator for generating microwave frequency radiation comprising:

an oscillator body having formed therein a waveguide and a substantially cylindrical bore intersecting the waveguide; and a package comprising a heat sink having a substantially cylindrical portion and an oscillatory semiconductor device supported at one end of the heat sink; in which the diameter of the cylindrical portion of the heat sink in relation to the diameter of the cylindrical bore is such that the heat sink is supported in the cylindrical bore by one of a) an interference fit, and b) a tight sliding fit, with the semiconductor device being located in the waveguide, and wherein the heat sink is provided with a peripheral layer of soft deformable material which provides the tight sliding fit or interference fit within the cylindrical bore of oscillator body, thereby providing good electrical contact between the heat sink and the oscillator body over substantially all the cylindrical outer surface of the heat sink.

* * * * *

UNITED STATES PATENT AND TRADEMARK OFFICE
CERTIFICATE OF CORRECTION

PATENT NO.      : 6,545,553 B1
DATED           : April 8, 2003
INVENTOR(S)     : John Bird et al.

It is certified that error appears in the above-identified patent and that said Letters Patent is hereby corrected as shown below:

<u>Title page</u>,
Item [73], please change the Assingee's name to read as follows:
-- Dynex Semiconductor Limited --.

Signed and Sealed this

Fifth Day of August, 2003

JAMES E. ROGAN
*Director of the United States Patent and Trademark Office*